(12) United States Patent
Keller

(10) Patent No.: US 6,413,359 B1
(45) Date of Patent: Jul. 2, 2002

(54) PLASMA REACTOR WITH HIGH SELECTIVITY AND REDUCED DAMAGE

(75) Inventor: John H. Keller, Newburgh, NY (US)

(73) Assignee: K2 Keller Consulting, Newburgh, NY (US)

( * ) Notice: Subject to any disclaimer, the term of this patent is extended or adjusted under 35 U.S.C. 154(b) by 0 days.

(21) Appl. No.: 09/542,989

(22) Filed: Apr. 4, 2000

(51) Int. Cl.$^7$ .......................... H05H 1/00; C23C 16/00
(52) U.S. Cl. .......................... 156/345.48; 156/345.49; 156/345.47; 118/723 AN; 118/723 I; 118/723 E
(58) Field of Search .................. 156/345.48, 345.49, 156/345.47, 643.1; 118/723 AN, 723 I, 723 MA, 723 MR, 723 E; 216/68

(56) References Cited

U.S. PATENT DOCUMENTS

| | | |
|---|---|---|
| 4,948,458 A | 8/1990 | Ogle |
| 5,304,279 A | 4/1994 | Coultas et al. |
| 5,556,501 A * | 9/1996 | Collins et al. ............... 156/345 |
| 5,565,738 A | 10/1996 | Samukawa et al. |
| 5,707,486 A | 1/1998 | Collins |
| 5,711,850 A * | 1/1998 | Okumura et al. ......... 156/643.1 |
| 5,783,102 A | 7/1998 | Keller |
| 5,810,932 A * | 9/1998 | Ueda et al. ............... 118/723 I |
| 5,919,382 A * | 7/1999 | Qian et al. ............. 219/121.52 |
| 5,944,902 A * | 8/1999 | Redeker et al. ....... 118/723 AN |
| 6,158,384 A * | 12/2000 | Ye et al. .................... 118/723 I |
| 6,164,241 A * | 12/2000 | Chen et al. ............... 118/723 I |
| 6,244,211 B1 * | 6/2001 | Nishikawa et al. ... 118/723 AN |

FOREIGN PATENT DOCUMENTS

JP  2001-52895 A * 2/2001  ............ H05H/1/46

* cited by examiner

Primary Examiner—Gregory Mills
Assistant Examiner—P. Hassanzadeh
(74) Attorney, Agent, or Firm—Whitham, Curtis & Christofferson, P.C.

(57) ABSTRACT

Uniformity of plasma density is enhanced at high plasma density and with reduced gas cracking and/or without electron charging of a workpiece by limiting coupling of voltages to the plasma and returning a majority of RF current to elements of an antenna driven with different phases of a VHF/UHF signal and/or providing a magnetic filter which separates a hot plasma region from a cold plasma region along a side of the chamber and further provides a preferential drift path between the hot and cold plasma regions. The magnetic field structure of the magnetic filter is preferably closed at one end or fully closed to surround the plasma. Additional magnetic elements limit the transverse field at the surface of a workpiece to less than 10 Gauss. Either or both of the antenna and the magnetic filter can be retrofitted to existing plasma reactor vessels and improve the performance and throughput thereof.

12 Claims, 8 Drawing Sheets

PLASMA REACTOR WITH HIGH SELECTIVITY AND REDUCED DAMAGE

BACKGROUND OF THE INVENTION

1. Field of the Invention

The present invention generally relates to radio frequency plasma processing reactors, especially as used in semiconductor processing and, more particularly, to high throughput reactors capable of achieving high etch rates with high material selectivity with reduced damage to extremely thin layers of material.

2. Description of the Prior Art

Processing of semiconductor materials to form integrated circuits has become highly sophisticated and is presently capable of producing very high performance circuit elements at very small feature size regimes and extremely high integration density. As devices are scaled to small sizes manufacturing and process tolerances are also reduced and structures formed must be of increasingly exact dimensions in order to provide desired electrical characteristics. Further, many types of structures become much more subject to damage during manufacturing processes. Moreover, manufacturing processes increasingly rely upon selectivity between materials to form structures of sub-lithographic dimensions and to maintain independence between processes so that results of particular processes are confined to the intended structures.

In particular, as metal-oxide-semiconductor (MOS) field effect transistors and capacitors are scaled to smaller sizes, the thickness of oxide insulators must be reduced to a thickness of often much less than 80 Angstroms. Such a thin structure is particularly subject to damage from receiving charge build-up thereon which can cause breakdown and damage to the thin oxide film, particularly from charged particles produced in plasma processes such as reactive ion etching (RIE) of other structures. Such charge build-up can occur through several mechanisms such as insufficiently complete neutralization of surface charge, non-uniform plasma density and potential, electrons diffusing out of the plasma when the electron temperature is too high and collecting on the top surface of high aspect ratio structures and/or excessive RF bias on the workpiece.

Unfortunately, plasma processes have such advantages in terms of predictability, repeatability and throughput that they remain the process of choice notwithstanding the increased likelihood of oxide damage. Accordingly, the plasma conditions must be closely chosen and regulated to reliably form structures without loss of significant manufacturing yield to oxide damage. Such regulation of plasma conditions is often inconsistent with economically acceptable levels of plasma reactor throughput.

Numerous ways are known for producing a plasma in a plasma reactor vessel or tool. However, particle interactions within a plasma are very complex and the production of some desirable plasma conditions are often linked with other undesirable conditions in various known plasma processes such that the desirable condition cannot be independently achieved.

For example, known RF plasma systems do not produce sufficient plasma density to support production throughput levels without becoming a direct source of oxide and device damage. Further, these systems produce an excessive electron temperature near the wafer which can also cause damage. Modification of these systems by the addition of magnetic fields to concentrate the plasma have resulted in damaging non-uniform plasmas.

Electron cyclotron resonance (ECR) plasma systems have been used and provide an increase in plasma density but also produce non-uniform plasmas and excessive electron temperatures near the wafer. More recently, inductively coupled plasma (ICP) systems, as disclosed in U.S. Pat. Nos. 4,948,458 and 5,304,279, have been used to produce plasmas of sufficient uniformity and density but with insufficient selectivity, particularly for oxides and low dielectric constant ("low K") materials, due to the production of additional undesired radicals from the etchants required for oxides, referred to as gas cracking. ECR plasma systems also produce significant levels of oxide and device damage.

U.S. Pat. Nos. 5,565,738 and 5,707,486 disclose VHF/UHF plasmas using power at frequencies in excess of about 40 MHz. These plasmas have the advantage of producing a lower electron temperature plasma with an enhanced high energy "tail" in the energy distribution of the electrons produced which leads to increased ionization for the same or a reduced level of gas cracking. However, these plasma sources produce VHF/UHF voltages in the plasmas thus producing plasma density variation due to ionization in undesired locations within the reactor vessel; both of which are sources of damage to oxides and devices.

U.S. Pat. No. 5,783,102 describes production of a cooler electron reactive plasma and negative ion plasmas by using an internal magnetic filter to separate the hot electron plasma near the plasma generation location in the plasma reactor from cooler electron plasma more proximate to the workpiece or wafer. However, this technique results is an unacceptable reduction of ion current to the wafer and the internal magnets within the reaction vessel can be a source of wafer contamination.

It has been shown in the field of neutral beam injection using negative hydrogen sources that a large magnetic field applied externally to the extractor as a filter can reduce electron density and temperature. However, these systems have a rectangular geometry which is undesirable for a plasma processing reactor. Using diode ring magnets to obtain a desired circular geometry produces non-uniform plasma density, and potential and non-uniform electron temperature as well, and thus produce both damage and non-uniform etching.

In summary, known plasma processing reactors and plasma production and confinement techniques have not heretofore been capable of producing a substantially uniform plasma at the workpiece or wafer with sufficiently high plasma density to support production throughput levels while being highly selective and avoiding damage, particularly of oxides and low K materials. Therefore, uniform etching of oxides and insulators selectively to underlying layers cannot be reliably achieved at production throughput levels without significant reduction of manufacturing yield due to damage from charging effects of the plasma.

SUMMARY OF THE INVENTION

It is therefore an object of the present invention to provide a plasma processing reactor capable of producing a highly uniform plasma of increased plasma density and reduced electron temperature.

It is another object of the invention to provide a plasma etching process capable of reliably etching insulator films with high selectivity and limited, if any, damage.

It is another object of the invention to provide an antenna and/or a magnetic filter suitable for retrofitting existing reactor vessels to improve uniformity of plasma processes while increasing throughput and manufacturing yield.

In order to accomplish these and other objects of the invention, an antenna and a plasma tool including the antenna are provided, the antenna including a plurality of elements, and an arrangement including a delay line for applying VHF/UHF power to respective antenna elements with respective phase differences such that a majority of RF current to the plasma is returned to other respective antenna elements and voltages in said plasma are substantially canceled.

In accordance with another aspect of the invention, a magnetic filter and plasma tool including the magnetic filter are provided for separating a hot plasma region from a cold plasma region, wherein the magnetic filter is located outside a cavity of the plasma tool and further includes an arrangement for providing a preferential drift path for charged particles connecting the hot plasma region and the cold plasma region.

Either or both of the antenna and the magnetic filter may be retrofitted to existing plasma reactor vessels and provide increased plasma density to improve process throughput and high plasma uniformity to improve uniformity of etching or other processing by returning VHF/UHF RF currents to the antenna and cancellation of voltages in the plasma within the plasma while maintaining material selectivity of the plasma process by avoidance of gas cracking and avoiding oxide and device damage by improved confinement and segregation of hot and cold electrons. Thus, use of the antenna or the magnetic filter or both in accordance with the invention, even in existing plasma tools, provides a combination of meritorious effects not possible prior to the invention.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
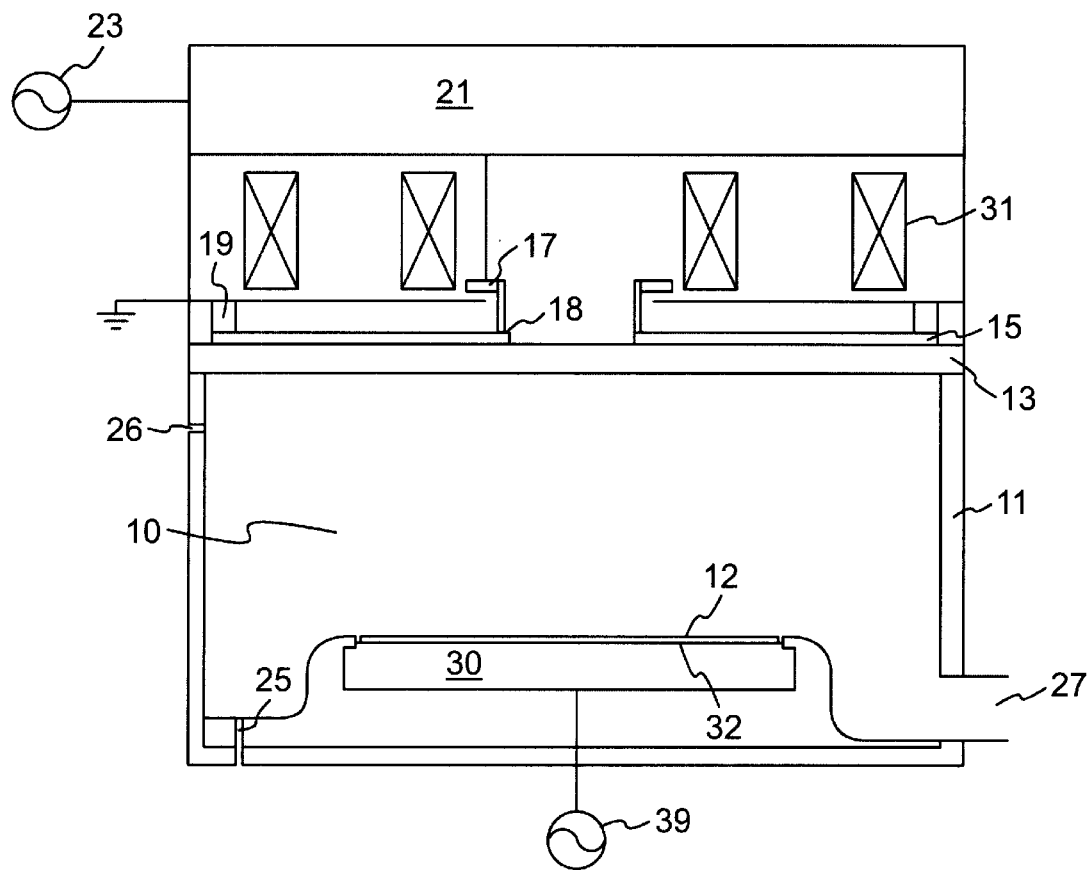
FIG. 1 is a cross-sectional view of a plasma reactor vessel including delay lines in accordance with the invention.

Referring now to the drawings, and more particularly to FIG. 1, there is shown a cross-sectional side view of a reactor vessel in accordance with the invention. It should be understood that many of the elements of the plasma reactor vessel are common to known plasma reactor vessels and are well-understood by those skilled in the art. Details of the plasma reactor vessel and known elements thereof are not critical to the practice of the invention and will be briefly summarized. This particular embodiment of the invention is suitable for use at pressures of above 10 mTorr characteristic of older plasma reactor vessels having lower pumping speed than current reactor vessel arrangements but can also be used at lower pressures as well.

Specifically, the reactor vessel includes walls 11 defining a chamber or cavity 10. A vacuum pump is connected to outlet duct 27 to maintain a high level of vacuum in the cavity 10 while reactant/etchant gas is supplied through one or more inlets 25, 26, positioned as may be found desirable for providing gas flow across workpiece or wafer 12 which is preferably positioned and held in place on electrode 30 with an electrostatic chuck 32. Radio frequency (RF) bias power at 13.56 MHz or less is applied to electrode 30 from RF source 39.

An electromagnet 31 is preferably provided to adjust the radial and transverse magnetic field position above the wafer 12 and thus adjust the radial or transverse uniformity of the plasma above the wafer. The impedance 19 (e.g. a distributed or lumped capacitance and inductance formed by a plate supporting connections 14 to antenna elements) of the return path of the VHF/UHF current may also be adjusted to adjust radial or transverse uniformity of the plasma, as well, in addition or alternatively to use of electromagnet 31.

The plasma is principally created by Very High Frequency or Ultra High Frequency (VHF/UHF—above 40 Mhz) power provided from source 23 and coupled to the gas in chamber 10 by antenna 15 (to which the VHF/UHF power is applied through matching network 21) through a dielectric window 13. This capacitively coupled power can stochastically heat the electrons in the plasma, thus producing a plasma with "hot tail" electrons with much reduced gas cracking (to maintain material selectivity of the etch). Use of VHF/UHF power in this way can start and maintain a plasma at pressures as low as 1 mTorr at power levels as low as about one watt.

Figure 2A:
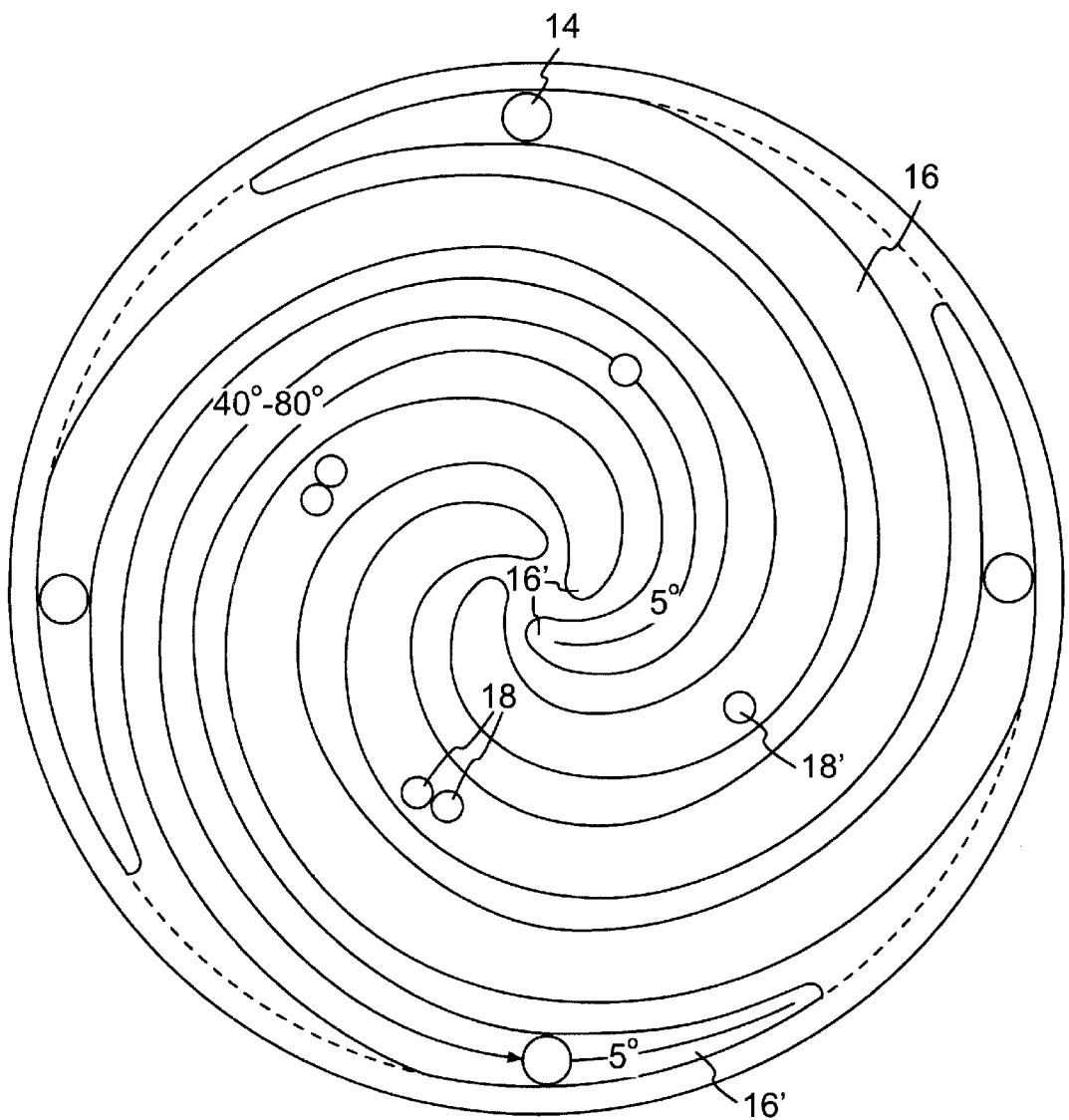
FIGS. 2A and 2B are plan views of a first preferred form of antenna in accordance with the invention.
Figure 2B:
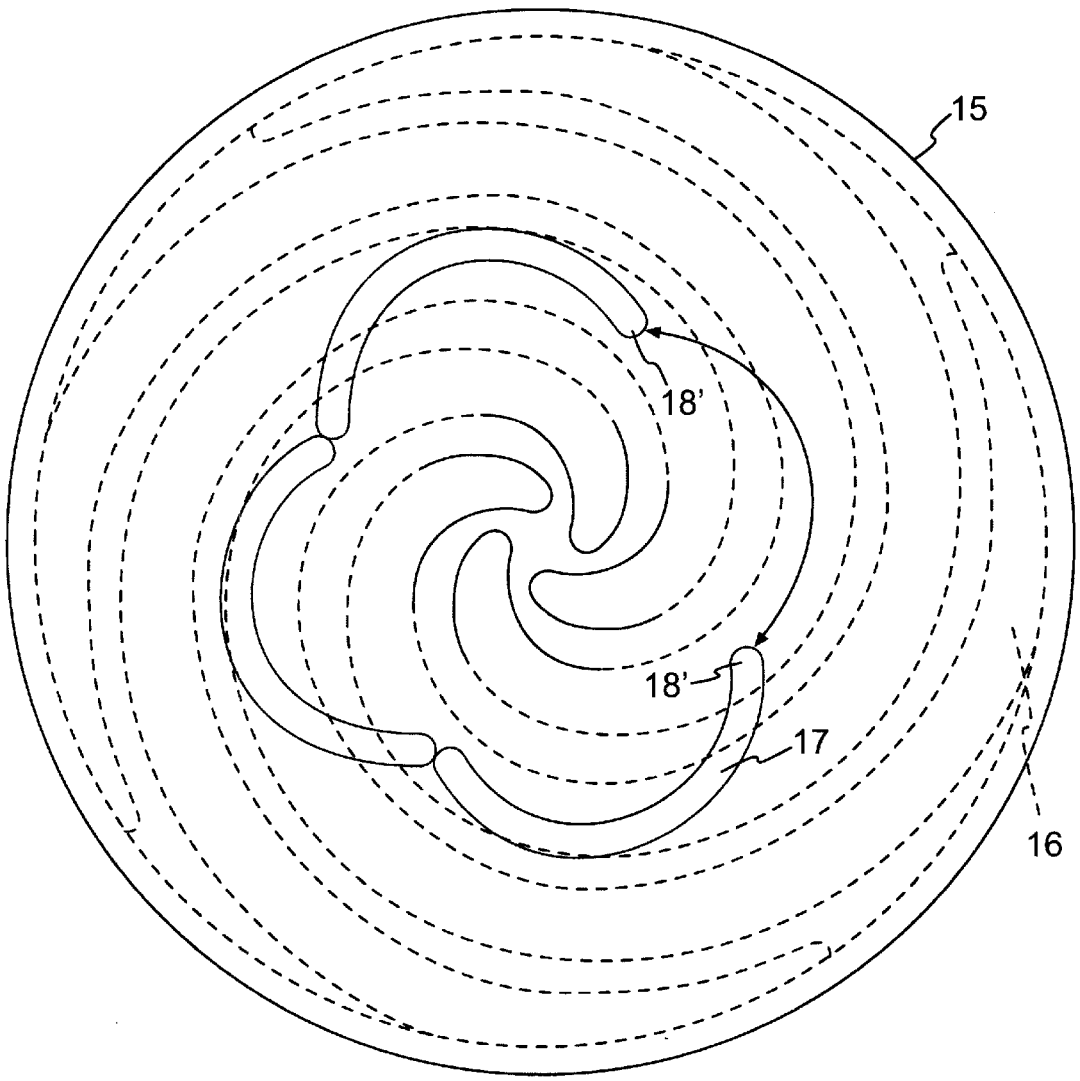

In accordance with an important feature of the present invention, the VHF/UHF signal is applied to different parts of the antenna (a preferred form of which is shown in FIG. 2A) through delay lines 17, shown in greater detail is FIG. 2B. In order to reduce or avoid one source of potential damage to the wafer or workpiece and/or layers formed thereon, the invention substantially avoids applying voltage to the plasma (which causes non-uniformity of plasma density) by distributing the VHF/UHF power to different parts of the antenna with different phases such that the major portion of the VHF/UHF current from the antenna to the plasma is returned through other parts of the antenna. The VHF/UHF power is thus capacitively coupled to the plasma such that the voltage in the plasma due to the voltage on one part of the antenna is effectively cancelled by another part of the antenna beyond a very short distance within the plasma adjacent the dielectric window 13 where heating of the plasma occurs.

More specifically and referring now to FIGS. 2A and 2B, a preferred form of the antenna 15 is comprised of a plurality of preferably arcuate conductive segments or elements. The number of elements and their shape is not particularly critical to the practice of the invention but it is preferred that the segments be closely spaced, radially symmetrical and cover a substantial portion of the dielectric window 13. It is also preferred to increase the capacitance of elements 16 to ground so that the change in impedance when the plasma is formed will be minimized. The elements are preferably formed as a metal (e.g. copper) layer or foil on an insulated substrate and may be optionally plated or covered with a more highly conductive material (e.g. silver or gold). All or part of any or all of antenna 15, delay lines 17 and/or grounding impedance 19 may be formed as printed circuits for uniformity.

VHF/UHF power is applied to respective elements at locations 18, 18' and current returned through connections 14 shown in FIG. 2A. One of the locations 18' is directly connected to the matching network 21 and VHF/UHF power connected to the remainder of elements 16 through delay lines 17, shown in FIG. 2B. The delay lines may be straight, curved as shown or may have lumped electrical components. The delays should be such that the total phase difference around the entire antenna, as depicted by delay lines 17 and dashed arrow 17', at the fundamental frequency of the VHF/UHF power is 360° or a multiple thereof. In this regard, a further delay line 17 may be advantageously used at the location of dashed arrow 17' (to avoid reduction of voltage on the respective antenna elements 16) if the resistance of the plasma is such that the antenna has a very low quality factor, Q.

In this regard, while connections 14 and 18, 18' can be located at any points along each element 16, a phase shift will occur along each of the elements 16 and the greater the distance between locations 18, 18' and locations 14 (where grounding impedance 19 is connected) the greater the electrical length, phase shift and voltage variation will be along each element including distal ends 16'. (This phase delay may also form part of delay lines 17.) Preferably, the electrical length will be such that the phase difference between locations 14 and 18, 18' will be about 40° to 80° and slightly greater over the entire element, providing a good distribution of locations over the area of antenna 15 at which complementary voltages are present. Voltages may be advantageously increased near the perimeter of the antenna by adjustment (e.g. by design, modification or the like) of the distributed or lumped impedance 19. Thus voltages capacitively coupled to the plasma are fully or partially cancelled within a short distance from the dielectric window 13 (and only slightly beyond the plasma sheath) and thus do not compromise uniformity of the plasma density near the surface of the wafer or workpiece 12.

Figure 3A:
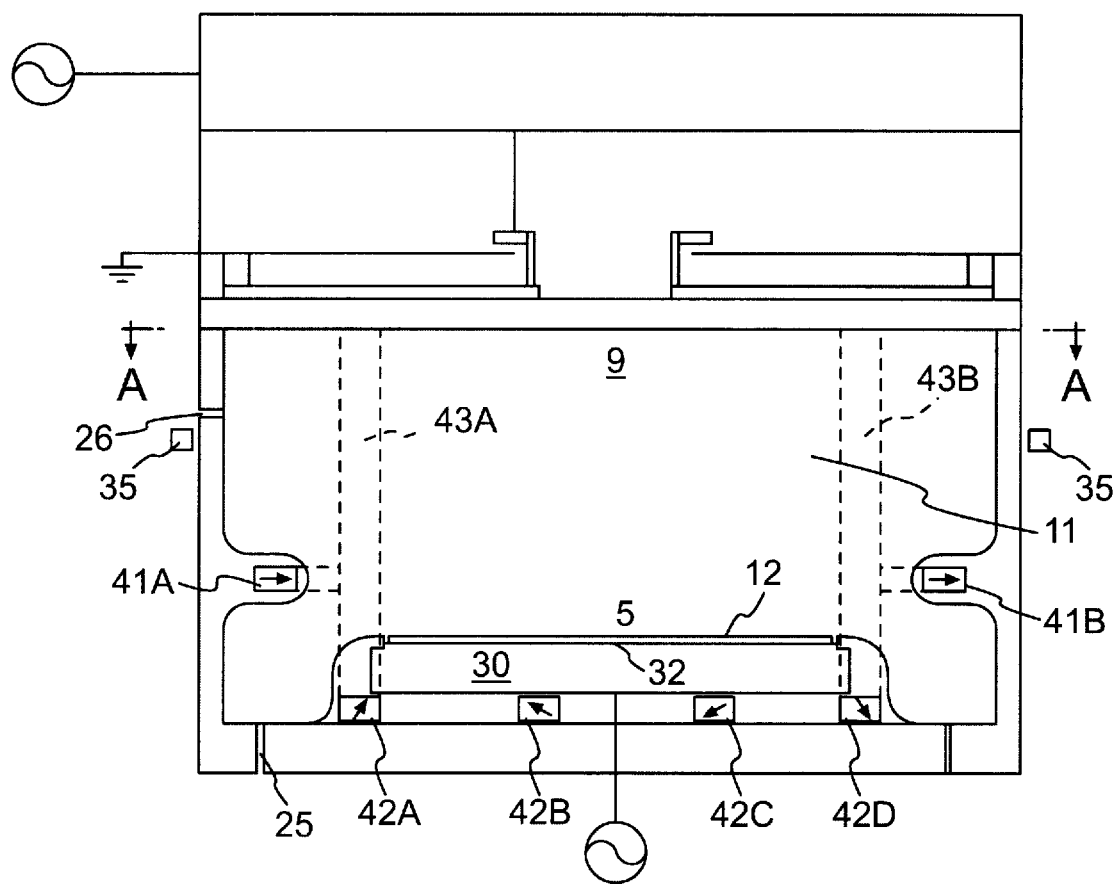
FIG. 3A is a cross-sectional view of a plasma reactor vessel including a simple magnetic filter in accordance with a variant form of the invention.
Figure 3B:
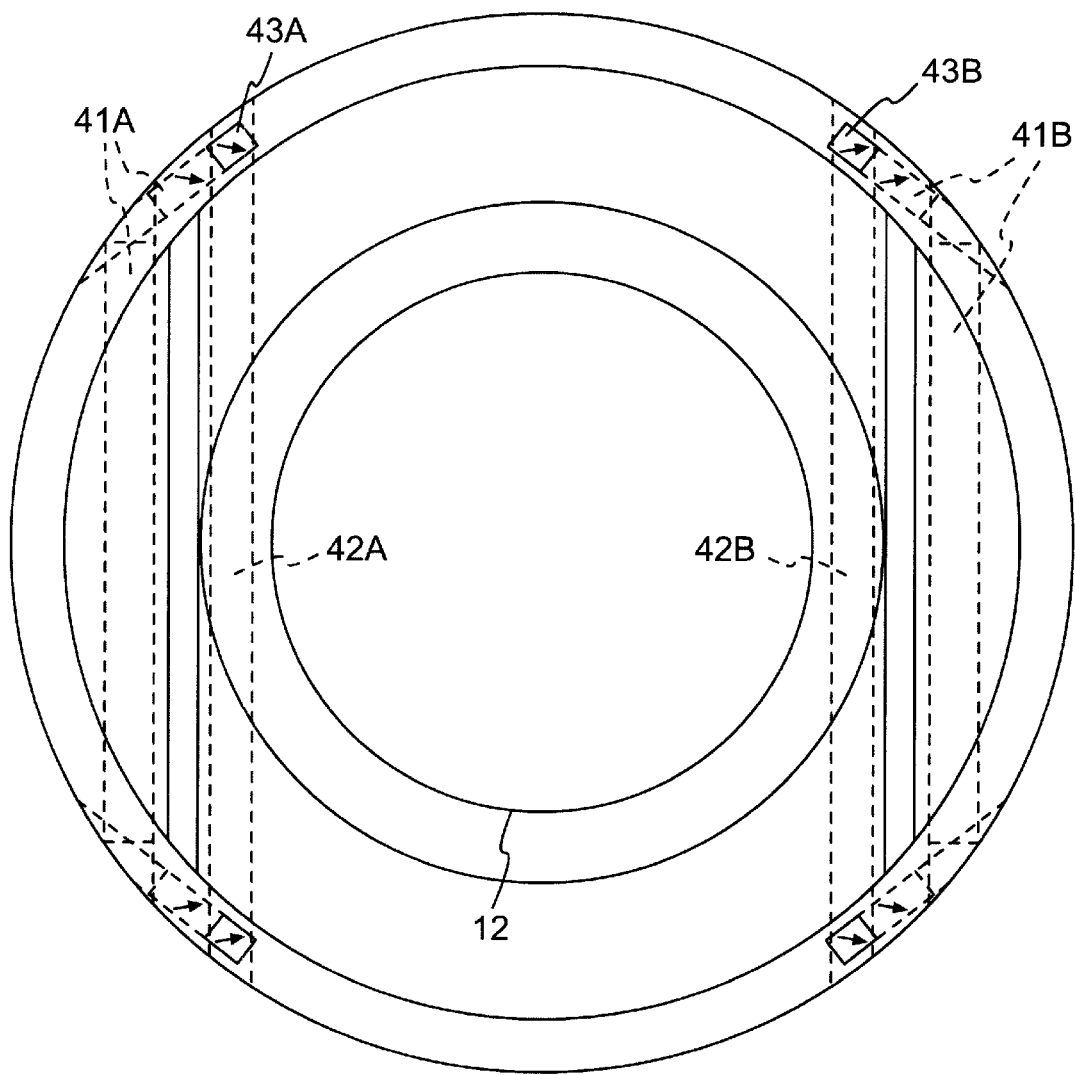
FIG. 3B is a sectional view (looking down from the middle of the chamber) of the reactor vessel of FIG. 3A further illustrating the configuration of the simple magnetic filter.

Referring now to FIGS. 3A and 3B, a variant form of the invention including a simple magnetic filter is shown in cross-section. The plasma reactor vessel of FIGS. 3A and 3B is identical to FIG. 1 but for the inclusion of the simple magnetic filter although some elements shown in FIG. 1 are omitted for clarity. This embodiment of the invention is particularly well-suited to operation at pressures in the 1 mTorr to 40 mTorr range. The plasma can be created by VHF/UHF power or in other ways such as ECR or Helicon sources alluded to above while yielding good selective etch results with minimal, if any, damage by virtue of the magnetic filter which serves to further separate hot and cold electrons and increase uniformity of plasma density near the wafer or workpiece.

The simple magnetic filter is principally comprised of two pairs of elongated magnetic elements 41A, 41B and 43A, 43B although a unitary construction cam be used in which 41A and 43A are combined and 41B and 43B are combined. These elements are elongated permanent magnets which produce a magnetic field parallel to the surface of the workpiece and capable of producing a magnetic potential across the filter of 50–800 Gauss cm. All of these elements are located away from the face of the wafer and preferably outside the plasma reactor vessel or at lest covered by the walls thereof, as illustrated, to avoid contamination of the workpiece and attack by the reactive ions of the plasma, This magnet configuration provides a magnetic field structure which is referred to as closed at one end or side of the plasma.

In magnetic fields there is a preferential direction of drift of charged particles therein. The preferential direction of drift is a direction perpendicular to both a magnetic field and either a gradient therein or an electric field perpendicular thereto, referred to as dB×B or E×B, drift, respectively. A magnetic field structure is thus closed if electron drift is continuous and, if completely closed, will return an electron to its original location. (As used herein "closed on one end or side" means that the electron drift does not end or start at the side of the reactor vessel near the edge of the workpiece or wafer but is continuous with the drift from the magnetic field structure produced by magnets 43A, 43B at the side of the reactor.) In the case of a magnetic field structure said to be closed at one end or side of the plasma, electrons can drift to or from the wafer region along the magnetic field created by magnetic elements 43A and 43B.

At the same time magnetic elements 41A and 41B provide a magnetic field across the face of the wafer and a gradient perpendicular to the face of the wafer. Magnets 42A–42D may be used to produce the same effect and/or to increase uniformity of the magnetic field above the wafer in combination with magnets 41A and 41B. Therefore, charged particles have a preferential direction of drift across the face of the wafer (e.g. into or out of the plane of the page of FIG. 3A) while hot electrons are generally confined at a location remote from the wafer and near the location where the plasma is principally generated. Thus the cooler or "cold" electrons are maintained close to the wafer and drift across it with enhanced uniformity of density.

Figure 5:
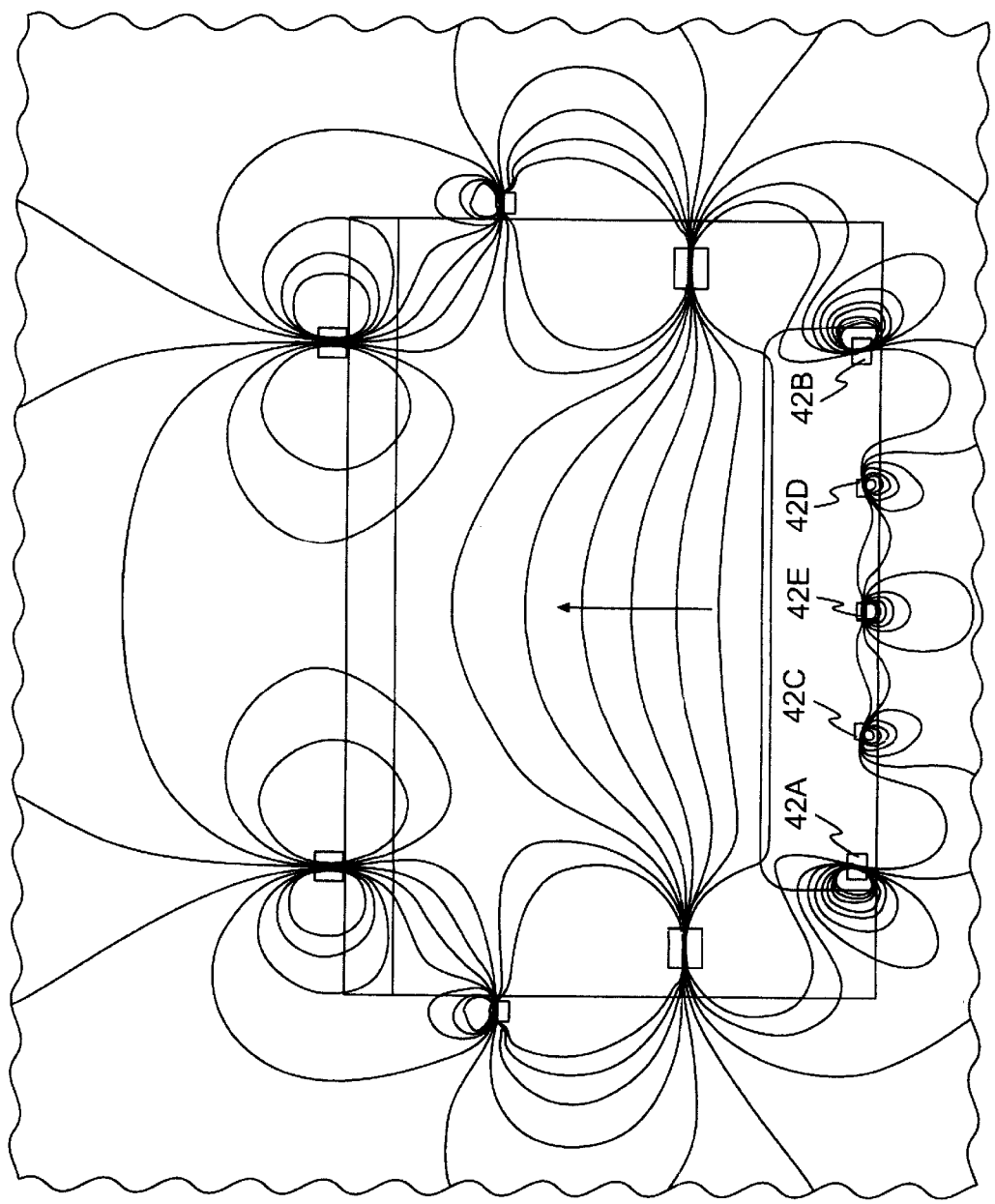
FIG. 5 is a side view (corresponding to the view of FIG. 4A) of the magnetic field produced by the completely closed magnetic filter.

It should be appreciated that while the location of magnetic elements 41A and 41B above the workpiece is preferred, a similar magnetic field above the wafer or workpiece can be alternatively achieved with elongated or annular magnets such as 42A, 42B (FIG. 3B), alternatively or supplementary to magnets such as 42A–42D of FIG. 3A (or 42A–42E of FIG. 5) below the wafer, as well, possibly incorporated into the electrostatic chuck 32. In practice, however, it is preferred to use magnetic elements 42A and 42B to adjust the magnetic field shape above the wafer to minimize the field transverse to (e.g. crossing the surface of) the wafer. The number, field strength and orientation of such magnetic elements can be readily adjusted to provide a transverse field of less than ten Gauss corresponding to a magnetic potential (the integral of the transverse field) across the wafer of less than thirty Gauss cm. which is sufficiently small to avoid damage to the wafer and layers formed on it.

Additionally, it will be appreciated by those skilled in the art that additional magnets can be employed outside the plasma reactor vessel as illustrated at 35 to produce surface magnetic fields that better confine the plasma and reduce plasma loss to sides of the reactor. It should also be appreciated that the closure of the magnetic field structure at sides of the plasma also beneficially affects magnetic confinement of the hot electrons and the uniformity of plasma density.

Figure 4A:
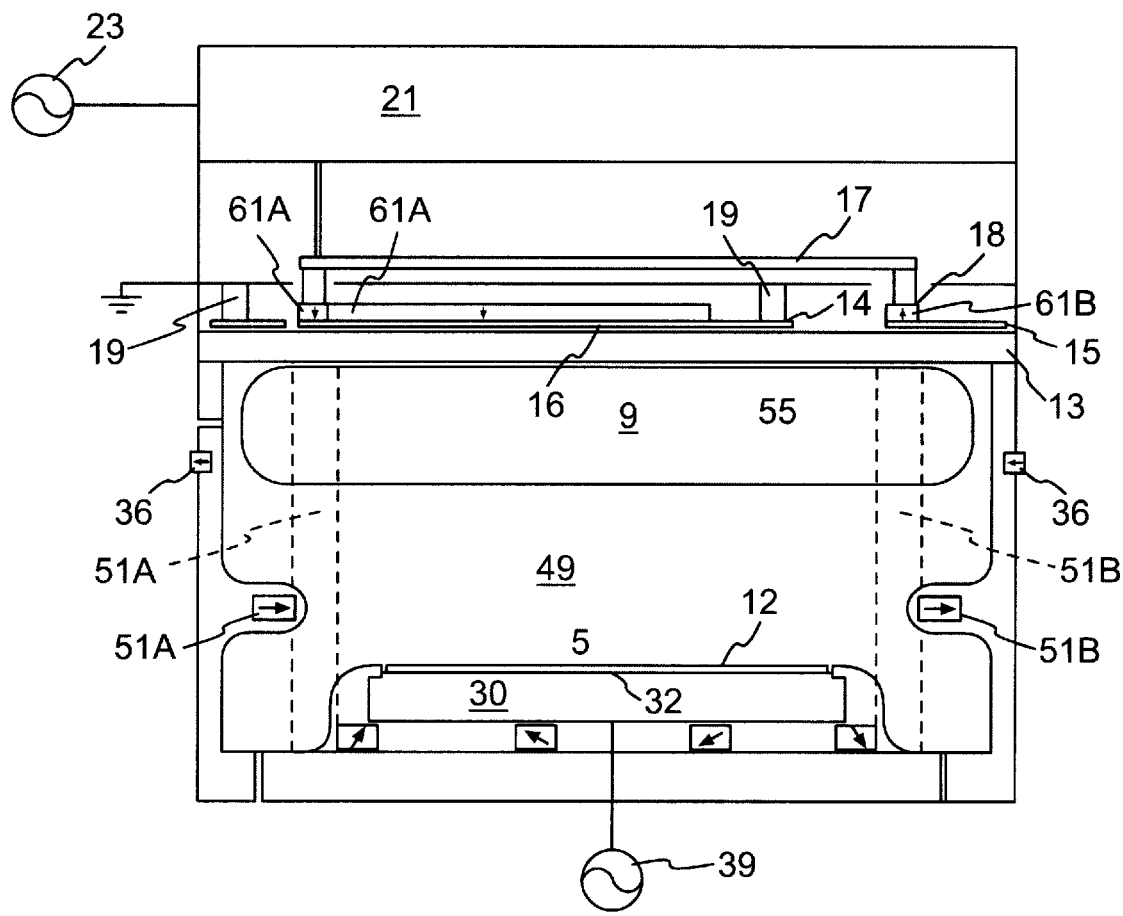
FIG. 4A is a cross-sectional view of a plasma reactor vessel including a completely closed magnetic filter in accordance with another variant form of the invention.
Figure 4B:
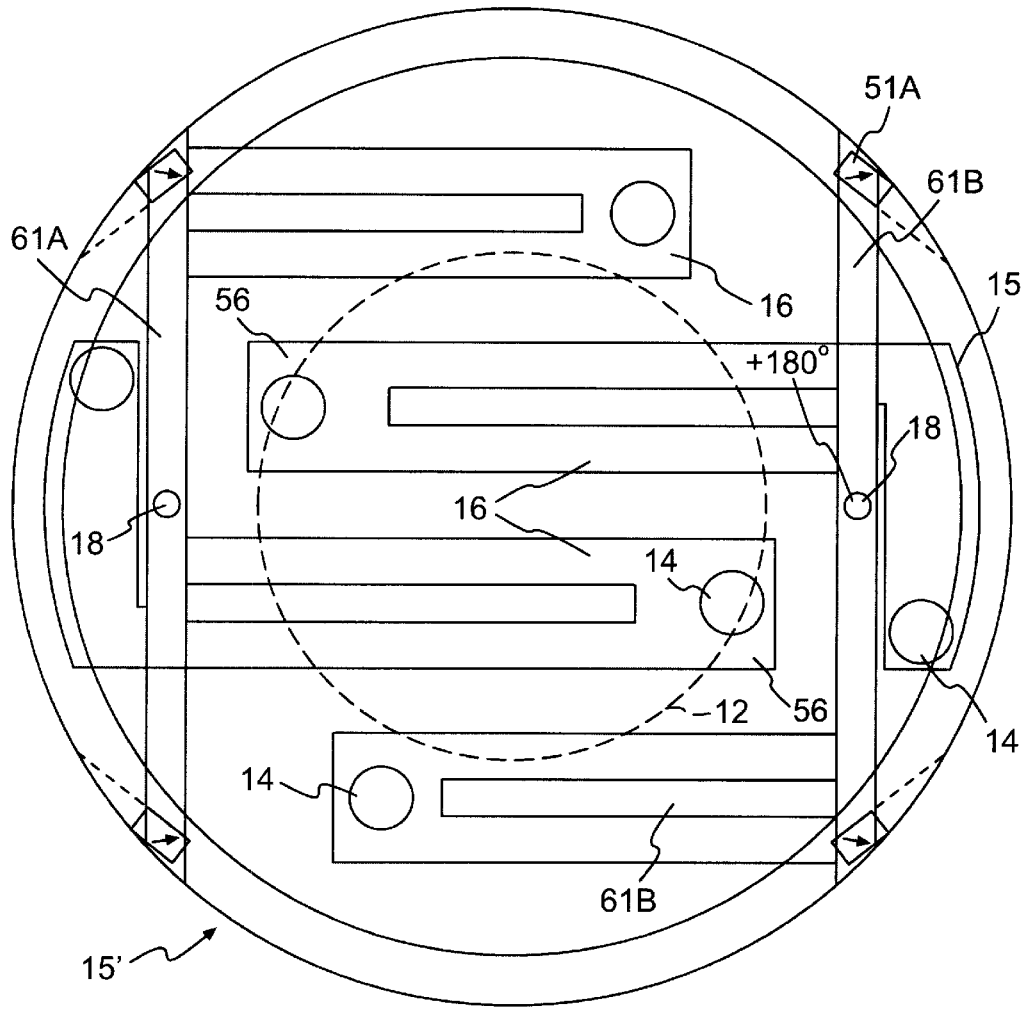
FIG. 4B is a top view of the reactor vessel of FIG. 4A further illustrating the configuration of the completely closed magnetic filter.

The charged particle drift due to the magnetic field. (e.g. E×B) of the filter will cause a surplus of electrons at one side of the chamber and a deficit at the other. Where there is a deficit of electrons, more hot electrons can diffuse from the plasma and increase temperature. Since neither a surplus nor a deficit of electrons is produced at sides of the chamber, hot electrons are better confined away from the workpiece or wafer and the cold electrons are confined close to the wafer surface by the filter formed by magnets 43A, 43B. Thus the magnetic filter function is improved and also prevents an uneven distribution or build-up of hot electrons across the plasma reactor vessel chamber which would otherwise occur due to use of the filter, Another variant form of the invention is illustrated in FIGS. 4A and 4B. FIG. 4A principally shows a variant form of the magnetic form of the magnetic filter having a completely closed magnetic field structure. FIG. 4B supplements illustration of the magnetic filter and further shows a variant form of the antenna 15 which, upon comparison with the form of the antenna shown in FIGS. 2A and 2B and the above description thereof will demonstrate principles of the invention by which many other variant forms of the invention will become apparent to those skilled in the art.

In FIG. 4A, magnetic elements 41A and 43A of FIGS. 3A and 3B are simply labelled 51A and magnetic elements 41B, 43B are simply labelled 51B for clarity and to correspond to the alternative unitary construction thereof alluded to above. The magnetic element 36 of FIG. 4A functions in the same manner as magnetic element 35 of FIG. 3A to confine the plasma but is oriented such that the magnetic field structure is also closed. Otherwise, structure which is common to the embodiments of both FIGS. 3A and 4A need not be further discussed.

The embodiment of FIG. 4A additionally includes magnetic elements 61A and 61B which serve to completely close the magnetic field structure. That is, the field structure from this combination of magnets fully surrounds and encloses the plasma as shown in a two dimensional computed section of the magnetic field provided as FIG. 5. (It should be noted that the field lines are almost exactly parallel to and do not intersect the surface of the wafer; thus providing a preferential drift path for charged particles which is also almost exactly parallel to the workpiece surface (perpendicular to the plane of the page). Since the field structure is fully closed, a closed circulation drift path for charged particles is provided, the magnetic filter function is further enhanced, uniformity of plasma density is improved while density of the plasma is increased without increasing and possibly reducing gas cracking (e.g. maintained with lower power input). Again, current through connection 14 to distributed or lumped impedance 19 can be adjusted to regulate the two-dimensional distribution of the plasma.

The magnetic elements 61A and 61B are preferably formed in the shape of the letter "F", as best seen in FIG. 4B, either integrally or as individual straight or curved sections. The shape is not particularly critical to the practice of the invention but the form illustrated is particularly well-integrated with the variant form of the antenna also illustrated in FIG. 4B. In fact, it is preferred to provide a highly conductive metallic coating on magnetic elements 61A and 61B so as to reduce any RF losses in magnets 61A, 61B and to provide a conductive path to elements 16 around the magnets including connections 18, 18'.

The operation of the antenna 15' is somewhat similar to that described above. However, in the case of FIG. 4B, the delay line may or may not be located on the antenna itself and provides a phase difference of 180° between electrodes/ magnets 61A and 61B. Thus the voltage placed on the plasma by one of electrodes 16 through 61A or 61B is cancelled by the other and the dominant portion of VHF/ UHF current is returned through the opposite half of the antenna. This effect is enhanced by the symmetry of the antenna and the return current connections 14 which are located at different distances from power inputs 18 and producing different phase shifts along the different lengths of conductive antenna elements 16. Thus the quiescent plasma has very little voltage on it and is quite uniform.

This configuration of the magnetic filter, particularly when used in connection with the variant form of the antenna shown in FIG. 4B, produces a cold electron plasma 5 over the wafer 12 and is suitable for use at pressures which may range from 0.5 to 40 mTorr. Therefore, improved performance may be achieved with plasma sources other than the preferred VHF/UHF plasma generation technique discussed above.

In view of the foregoing, it is seen that the invention provides increased plasma density and uniformity and retains material selectivity by avoidance of gas cracking while avoiding damage to thin insulator films and other structures formed by the plasma process. The invention thus provides a technique of reliably etching insulator films to thicknesses of less than eighty Angstroms with high throughput and without compromise of manufacturing yield. The improved performance provided by the antenna or the magnetic filter which is either closed at one end or completely closed or the combination of the antenna and the magnetic filter in accordance with the invention allows improved performance and increased throughput to be obtained while maintaining selectivity and avoiding oxide and device damage by retrofitting either or both to existing plasma reactor vessels with other plasma sources and which are operable over different pressure ranges.

While the invention has been described in terms of a single preferred embodiment, those skilled in the art will recognize that the invention can be practiced with modification within the spirit and scope of the appended claims.

Having thus described my invention, what I claim as new and desire to secure by letters patent is as follows:

1. A plasma tool including
    an antenna having a plurality of elements for capacitively coupling power to a plasma,
    means including a delay line for applying VHF/UHF power to respective ones of said plurality of elements with respective phase differences such that a majority of RF current to the plasma is returned to other respective ones of said elements and voltages in said plasma are substantially canceled and wherein said respective ones of said elements are connected through an RF impedance to ground.

2. A plasma tool as recited in claim 1, wherein power connection and return locations on said elements are spaced to achieve a phase shift of voltage along respective ones of said plurality of elements.

3. A plasma tool as recited in claim 1, further comprising a magnetic filter.

4. A plasma tool as recited in claim 3, wherein a magnetic field structure of said magnetic filter is closed at one end.

5. A plasma tool as recited in claim 3, wherein a magnetic field structure of said magnetic filter is completely closed.

6. A plasma tool as recited in claim 1, wherein said RF impedance is adjustable.

7. A plasma tool as recited in claim 1, further including magnetic means for adjusting radial uniformity of said plasma.

8. An antenna for capacitively coupling power to a plasma including
    a plurality of elements, means including a delay line for applying VHF/UHF power to respective ones of said plurality of elements with respective phase differences such that a majority of RF current to the plasma is returned to other respective ones of said elements and voltages in said plasma are substantially canceled, and an RF impedance for connecting respective ones of said plurality of elements to ground.

9. An antenna as recited in claim 8, wherein power connection and return locations on said elements are spaced to achieve a phase shift of voltage along respective ones of said plurality of elements.

10. An antenna tool as recited in claim 8, further comprising a magnetic filter.

11. An antenna as recited in claim 10, wherein a magnetic field structure of said magnetic filter is closed at one end.

12. An antenna as recited in claim 10, wherein a magnetic field structure of said magnetic filter is completely closed.

* * * * *